United States Patent
Chen

(10) Patent No.: US 6,291,301 B1
(45) Date of Patent: Sep. 18, 2001

(54) FABRICATION METHOD OF A GATE JUNCTION CONDUCTIVE STRUCTURE

(75) Inventor: Ming-Shing Chen, Kaohsiung Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/356,961

(22) Filed: Jul. 19, 1999

(51) Int. Cl.[7] ............... H01L 21/336; H01L 21/3205; H01L 21/4763; H01L 21/44
(52) U.S. Cl. ............ 438/303; 438/592; 438/682
(58) Field of Search ................ 438/301, 682, 438/303, 305, 592, 697

(56) References Cited

U.S. PATENT DOCUMENTS

| | | | |
|---|---|---|---|
| 5,045,916 | * 9/1991 | Vor et al. | 437/188 |
| 5,953,614 | * 9/1999 | Liu et al. | 438/303 |
| 6,015,753 | * 1/2000 | Lin et al. | 438/682 |
| 6,025,254 | * 2/2000 | Doyle et al. | 438/592 |

* cited by examiner

Primary Examiner—John F. Niebling
Assistant Examiner—Walter L. Lindsay, Jr.
(74) Attorney, Agent, or Firm—Thomas, Kayden, Horstemeyer & Risley, LLP

(57) ABSTRACT

A method of fabricating a gate junction conductive structure is described in which a selective silicon deposition method is used to form a silicon layer of a greater area on the polysilicon gate. A metal silicide process is further conducted on the silicon layer to convert the silicon layer to a metal silicide layer. Since the gate junction surface in forming the metal silicide layer is increased, not only the narrow line effect is prevented, the temperature for the thermal treatment process in forming the metal silicide layer is also lower. As a result, the sheet resistance of the metal silicide layer is lower and the device is more stable.

17 Claims, 2 Drawing Sheets

FABRICATION METHOD OF A GATE JUNCTION CONDUCTIVE STRUCTURE

BACKGROUND OF THE INVENTION

1. Field of the Invention

The present invention relates to a fabrication method of a semiconductor device. More particularly, the present invention relates to a fabrication method of a gate junction conductive structure.

2. Description of the Related Art

When the density of an integrated circuit is further increased, the device dimensions such as the line width, the contact surface area and the junction depth are continuously being reduced to a deep submicron level. To effectively ensure the functional integrity of the device, to lower the resistance and to minimize the RC delay resulted from a reduced resistance and capacitance, a metal silicide is commonly used in the manufacturing of a gate for lowering the contact resistance of a polysilicon gate. Since the formation of a metal silicide eliminates the needs of a photolithography process, the process is also being referred as a self-aligned silicide (salicide) process. Common examples of a self-aligned silicide include titanium silicide ($TiSi_x$) and cobalt silicide ($CoSi_x$).

In the conventional self-aligned silicide process, using titanium silicide as an example, a transistor device and the device isolation region are first completed. The transistor comprises a polysilicon gate and a source/drain region. A layer of titanium is deposited on the entire substrate, and thermal treatment is then conducted to form a silicide layer. Silicide is formed at the elevated temperature where titanium is in contact and reacted with the silicon of the gate and the surface of the source/drain region. The unreacted metal is removed, leaving only the titanium silicide layer on the surface of the gate and the source/drain region. After that, an annealing procedure is conducted to enhance the quality of the titanium silicide layer.

As the dimensions of a polysilicon gate are gradually being reduced, a narrow line effect often occurs. A narrow line effect may result from too small a gate dimension, less than 0.18 μm, such that the contact stress between the metal silicide and the polysilicon is too high during the formation of the metal silicide on the polysilicon gate. A narrow line effect may also result from too little a nucleation site, thereby reducing the quality of the metal silicide thin film, leading to an increase in the sheet resistance and affecting the operational efficiency of the gate.

To improve the quality of a metal silicide layer, a higher temperature by means of a rapid thermal processing (RTP) is used. A higher temperature, however, affects the characteristic of a shallow junction device. Furthermore, the issue of filament, which may lead to a shortage at the gate and at the source/drain region and resulted in a damage to the device, easily occurs between the gate and the source/drain region in the self-aligned silicide process.

SUMMARY OF THE INVENTION

This invention provides a fabrication method of a gate junction conductive structure in which the area of the gate junction surface for the formation of a metal silicide layer is increased. As a result, the occurrence of the narrow line effect is prevented. The sheet resistance and the temperature for the thermal treatment are also lower, thereby reducing the negative effect on the shallow junction device.

The present invention provides a fabrication method of a gate junction conductive structure in which a substrate is provided and the substrate comprises at least a gate. The gate comprises an exposed silicon conductive layer, for example a polysilicon layer. The sidewall of the silicon conductive layer comprises a spacer, and at both sides of the gate, a source/drain region is formed in the substrate. An insulation layer is further formed covering the silicon substrate and the gate. A portion of the insulation layer is removed until the silicon conductive layer is exposed. A selective silicon deposition process, in which silicon only deposits on the silicon type materials, is conducted to form a silicon layer on the silicon conductive layer. Since the area of the silicon layer is slightly greater than that of the silicon conductive layer, the occurrence of a narrow line effect is prevented. Using the silicon layer as a mask, a portion of the insulation layer is further removed to expose the source/drain region. A second spacer is also formed on the existing spacer over the spacer of the gate and covers portions of the source/drain region. A self-aligned metal silicide process is then conducted to convert the silicon layer and the surface of the source/drain region to a layer of metal silicide.

Since the silicon layer formed according to the present invention comprises a greater area, the gate junction surface for forming the metal silicide layer is also increased. With a greater gate junction surface, not only the narrow line effect can be prevented, the temperature required for the thermal treatment in forming the metal silicide layer is also lower. Thus, the metal silicide formed has a lower sheet resistance and is more stable. Furthermore, according to the present invention, a second spacer is formed in addition to the original spacer to increase the thickness of the spacer. In addition, the temperature used in forming the metal silicide layer is lower. Therefore, the issue of filament between the gate and the source/drain region can be prevented and the electric field between the two components is indirectly lowered. As a result, the stability of the device is improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

Figure 1A:
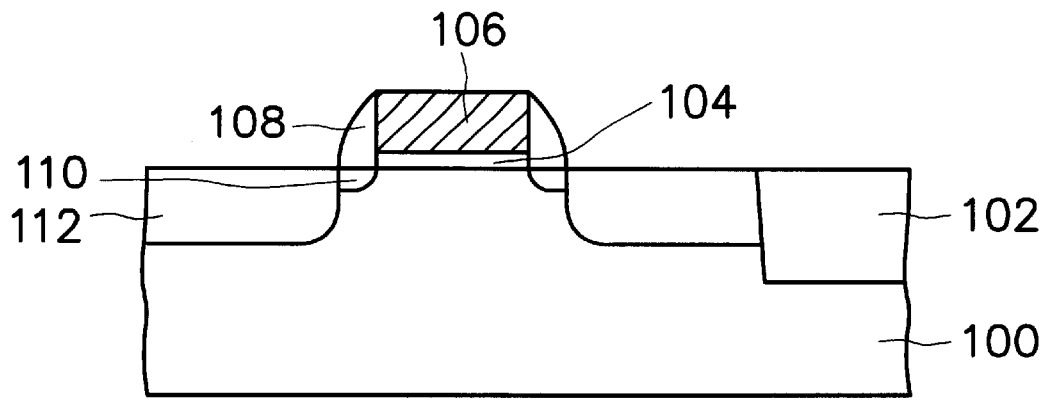
FIGS. 1A to 1F are cross sectional views of a MOS transistor device showing the manufacturing process of a gate junction conductive structure according to the present invention.

Referring to FIG. 1A, a silicon substrate 100 is provided and the substrate 100 is completed with the fabrication of a MOS transistor and a device isolation structure. The MOS transistor comprises at least a gate, a source/drain region 112 and a lightly doped drain 110. The gate comprises a gate oxide layer 104 and a gate silicon conductive layer 106 stacked from bottom to top, and a spacer 108 on the side wall of the gate oxide layer 104 and the gate silicon conductive layer 106. The gate silicon conductive layer 106 includes an exposed silicon layer, for example a polysilicon layer or a doped polysilicon layer. A source/drain region 112 locates at both sides of the gate in the substrate 100. A lightly doped drain 110 locates underneath the spacer 108 and extends along the source/drain region 112 in the substrate 100. The device isolation region includes a shallow trench isolation (STI) 102.

The fabrication process of the above MOS transistor includes a formation of a shallow trench isolation 102, followed by a sequential formation of a gate oxide layer 104 and a gate silicon conductive layer 106. After which, a lightly doped drain 110 and a spacer 108 are formed, followed by the formation of a source/drain region 112. The detailed manufacturing process of a MOS transistor can be easily achieved by those who are familiar with the technique, therefore will be not reiterated in the current embodiment.

Figure 1B:
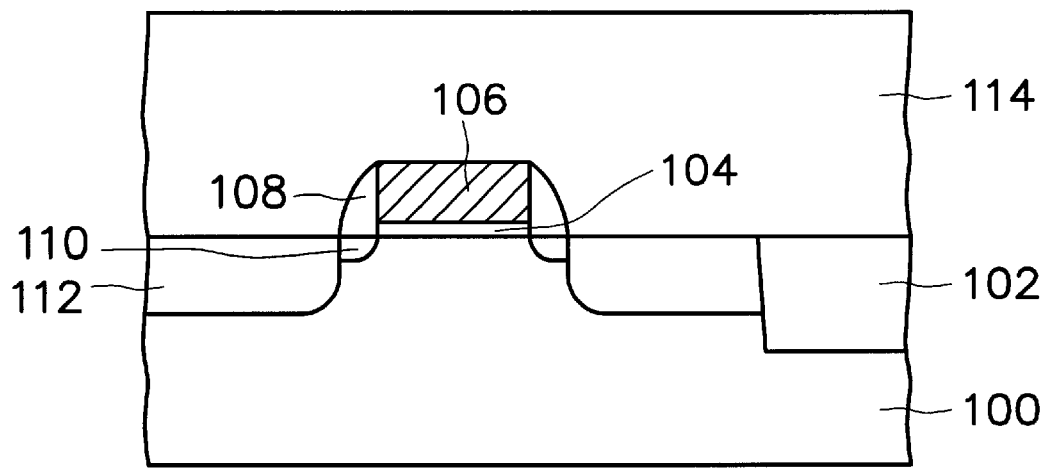

As shown in FIG. 1B, an insulation layer 114 is formed to cover the substrate 100 and the gate, for example a silicon oxide layer by methods including a chemical vapor deposition method (CVD).

Figure 1C:
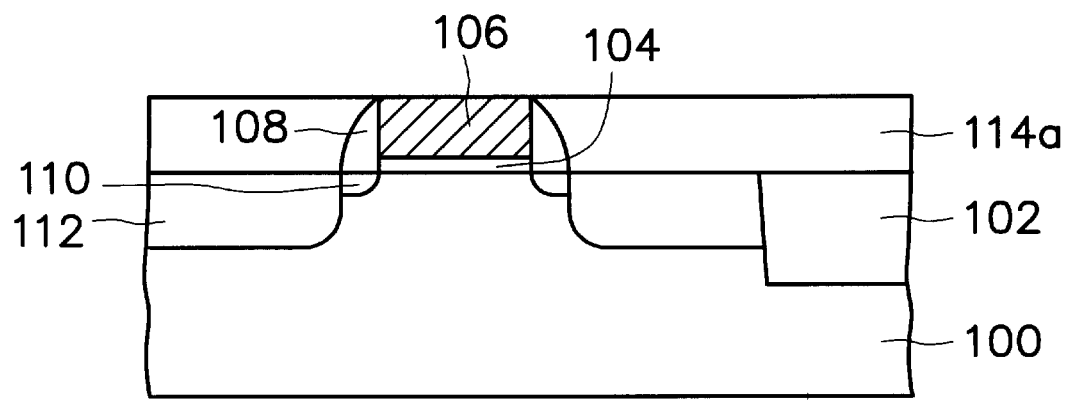

According to FIG. 1C, using the silicon conductive layer 106 as an etch stop layer, a portion of the insulation layer 114 is removed by methods including an etch back or a chemical mechanical polish technique (CMP) until the silicon conductive layer 106 is exposed. The remaining insulation layer 114a covers other parts of the substrate 100, hence, the unnecessary silicon deposition is avoided in a latter selective silicon deposition process.

Figure 1D:
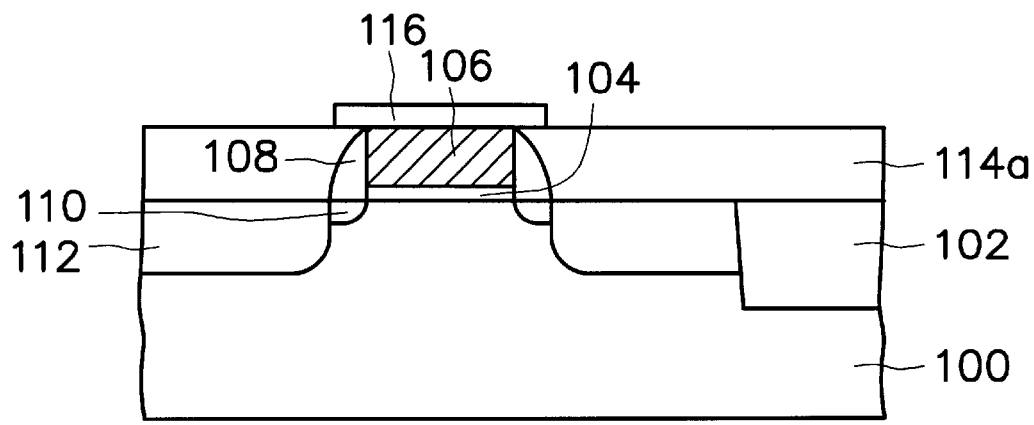

As shown in FIG. 1D, a selective deposition process is conducted in which a wafer with a substrate 100 is loaded in an epitaxial silicon (EPI) reactor. Taking the advantage of the characteristic of an EPI reactor in which silicon deposit only on a silicon material, but not on the silicon oxide layer, a silicon layer 116 is thus formed on the exposed silicon conductive layer 106. Furthermore, the silicon deposition is an isotropic deposition, silicon is therefore deposited in both the horizontal and the vertical directions. A silicon layer 116 extending over to a portion of the insulation layer is formed. A silicon layer 116 with a surface area greater than that of the silicon conductive layer 106 is thereby resulted.

Figure 1E:
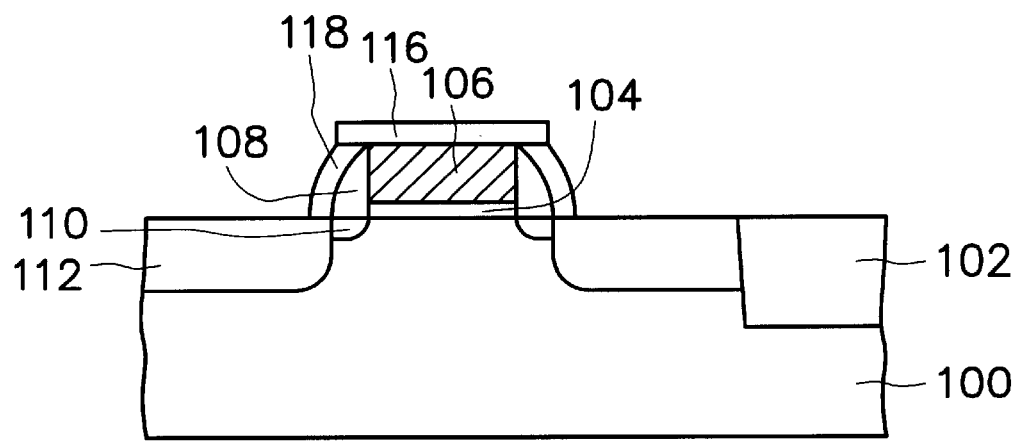

According to FIG. 1E, using the silicon layer 116 as a mask, a portion of the insulation layer 114a is removed to form an second spacer 118 on the outside wall of the spacer 108 and partially covers the source/drain region 112. The second spacer 118 is formed by methods including a spacer etching method of a dry etch process.

Figure 1F:
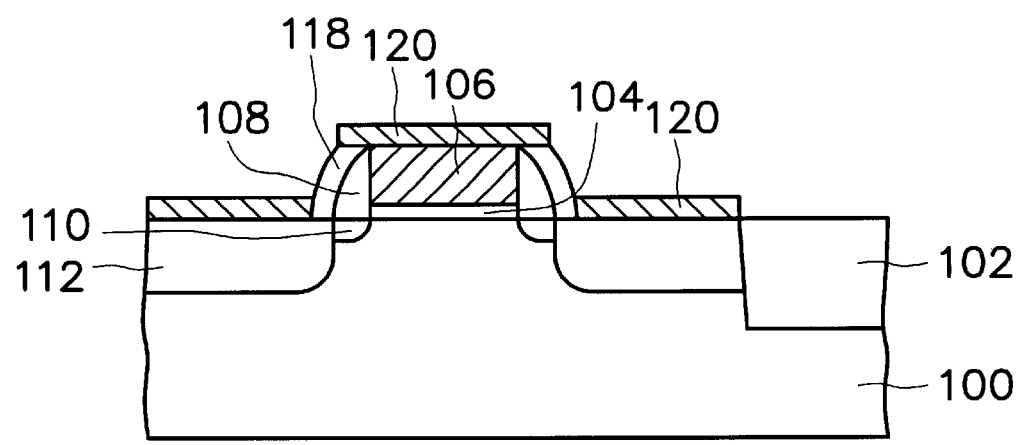

As shown in FIG. 1F, the silicon layer 116 and the surface of the source/drain region 112 are converted to a metal silicide layer 120, for example a titanium silicide layer or a cobalt silicide layer formed by a self-aligned silicide process. Using titanium silicide as an example, a layer of titanium is deposited on the entire substrate 100. The titanium layer, under thermal processing, reacts with the silicon of the gate and the surface of the source/drain region to form a titanium silicide. The unreacted titanium is then removed, leaving only the silicide. An annealing process is further conducted to enhance the quality of the titanium silicide layer.

Since the surface area of the silicon layer 116 is greater, only a lower temperature is needed to form a good quality metal silicide layer 120 on the surface of the source/drain region. Thus, the characteristics of a shallow junction device are less likely to be affected. The sheet resistance formed according to the present invention is lower and the device is more stable. Consequently, with an ultra thin silicon layer 116 and a second spacer to widen the existing spacer, the silicide filament issue resulted from the transferring of a metal silicide is therefore less likely to occur.

Furthermore, with the second spacer 118 to increase the thickness of the spacer, the distance between the electrical conductive metal silicide layer 120 and the gate silicon conductive layer 106 is increased, thereby the electric field between the two layers is indirectly decreased. Because a lower electric field prevents the hot carrier effect, the stability of the device is improved.

It is apparent from the preferred embodiment of the present invention that not only the narrow line effect occurred in a self-aligned silicide process is avoided, the sheet resistance is also lower and the device is more stable.

In addition, forming the second spacer on the outside wall of the spacer increases the thickness of the spacer, thereby the filament effect between the gate and the source/drain region is avoided. The electric field between the two components is lower and the stability of the device is increased. The temperature required to from the metal silicide layer is also lower thereby prevents any effect on the shallow junction device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a gate junction conductive structure comprising the steps of:

providing a substrate comprising at least a gate, and the gate comprising an exposed silicon conductive layer and a first spacer on a sidewall of the gate;

forming an insulation layer to cover the substrate and the gate;

removing a portion of the insulation layer until the silicon conductive layer is exposed;

forming a silicon layer on the silicon conductive layer with an area of the silicon layer greater than that of the silicon conductive layer;

conducting an etch back process to form a second spacer on a sidewall of the first spacer; and converting the silicon layer into a metal silicide layer.

2. The fabrication method of a gate junction conductive structure according to claim 1, wherein the silicon conductive layer includes a polysilcon layer.

3. The fabrication method of a gate junction conductive structure according to claim 1, wherein the insulation layer includes a silicon oxide layer.

4. The fabrication method of a gate junction conductive structure according to claim 1, wherein the silicon layer is formed by selectively depositing silicon on the silicon conductive layer but not on the insulation layer.

5. The fabrication method of a gate junction conductive structure according to claim 1, wherein the silicon layer converts to a metal silicide by methods include a self-aligned silicide process.

6. The fabrication method of a gate junction conductive structure according to claim 1, wherein the metal silicide layer includes a layer of titanium silicide.

7. The fabrication method of a gate junction conductive structure according to claim 1, wherein the metal silicide layer includes a layer of cobalt silicide.

8. The fabrication method of a semiconductor device comprising the steps of:

providing a silicon substrate comprising at least one gate and a source/drain region at two sides of the gate, the gate comprising an exposed silicon conductive layer and a side wall covered by a spacer;

forming an insulation layer to cover the substrate and the gate;

removing a portion of the insulation layer until the silicon conductive layer is exposed;

forming a silicon layer on the silicon conductive layer extending over to a portion of insulation layer;

removing a portion of the insulation layer to expose the source/drain region by using the silicon layer as a mask, so as to form a second spacer on the first spacer; and conducting a self-aligned silicide process to convert the silicon layer and a surface of the source/drain region to a metal silicide layer.

9. The fabrication method of a semiconductor device according to claim 8, wherein the silicon conductive layer includes a polysilicon layer.

10. The fabrication method of a semiconductor device according to claim 8, wherein the insulation layer includes a silicon oxide layer.

11. The fabrication method of a semiconductor device according to claim 8, wherein a portion of the insulation layer is removed by methods including a chemical mechanical polish technique.

12. The fabrication method of a semiconductor device according to claim 8, wherein the silicon layer is formed by selectively depositing silicon on the silicon conductive layer but not on the insulation layer.

13. The fabrication method of a semiconductor device according to claim 8, wherein the metal silicide layer includes a titanium silicide layer.

14. The fabrication method of a semiconductor device according to claim 8, wherein the metal silicide layer includes a cobalt silicide layer.

15. A fabrication method of a gate junction conductive structure comprising the steps of:

providing a gate comprising at least an exposed silicon conductive layer;

conducting a selective silicon deposition process to form a silicon layer on the silicon conductive layer, wherein the area of the silicon layer is greater than that of the silicon conductive layer; and converting the silicon layer to a layer of metal silicide.

16. The fabrication method of a gate junction conductive structure according to claim 15, wherein the silicon conductive layer includes a polysilicon layer.

17. The fabrication method of a gate junction conductive structure according to claim 15, wherein the silicon layer is converted to a layer of metal silicide by methods including a self-aligned silicide process.

* * * * *